US009932493B2

(12) United States Patent
Ekin et al.

(10) Patent No.: US 9,932,493 B2
(45) Date of Patent: Apr. 3, 2018

(54) ONE-COMPONENT, DUAL-CURE CONFORMAL COATING COMPOSITIONS

(71) Applicant: ALLNEX IP S.Á.R.L., Luxembourg (LU)

(72) Inventors: Abdullah Ekin, Coraopolis, PA (US); Michael J Dvorchak, Monroeville, PA (US)

(73) Assignee: Allnex Netherlands B.V., Bergen op Zoom (NL)

( * ) Notice: Subject to any disclaimer, the term of this patent is extended or adjusted under 35 U.S.C. 154(b) by 0 days.

(21) Appl. No.: 14/760,779

(22) PCT Filed: Jan. 10, 2014

(86) PCT No.: PCT/EP2014/050379
§ 371 (c)(1),
(2) Date: Jul. 14, 2015

(87) PCT Pub. No.: WO2014/111311
PCT Pub. Date: Jul. 24, 2014

(65) Prior Publication Data
US 2015/0353772 A1 Dec. 10, 2015

Related U.S. Application Data

(63) Continuation of application No. 13/956,462, filed on Aug. 1, 2013, now abandoned.

(60) Provisional application No. 61/752,548, filed on Jan. 15, 2013.

(51) Int. Cl.
C09D 175/14 (2006.01)
C09D 4/00 (2006.01)
B05D 3/06 (2006.01)
C08G 18/72 (2006.01)
C08G 18/79 (2006.01)
C08G 18/81 (2006.01)
C09D 175/16 (2006.01)
C08G 18/30 (2006.01)
H05K 3/28 (2006.01)
C08G 18/67 (2006.01)
C08G 63/08 (2006.01)
C08G 18/42 (2006.01)
C08G 18/78 (2006.01)

(52) U.S. Cl.
CPC ........... C09D 175/14 (2013.01); B05D 3/067 (2013.01); C08G 18/307 (2013.01); C08G 18/725 (2013.01); C08G 18/798 (2013.01); C08G 18/81 (2013.01); C09D 4/00 (2013.01); C09D 175/16 (2013.01); H05K 3/287 (2013.01); *C08G 18/4277* (2013.01); *C08G 18/672* (2013.01); *C08G 18/7837* (2013.01); *C08G 63/08* (2013.01); *H05K 3/284* (2013.01); *H05K 2201/09872* (2013.01)

(58) Field of Classification Search
CPC .............. C08G 18/672; C08G 18/4277; C08G 18/7837; C08G 18/798; C08G 63/08
See application file for complete search history.

(56) References Cited

U.S. PATENT DOCUMENTS

| 4,424,252 A | 1/1984 | Nativi | |
|---|---|---|---|
| 6,599,955 B1 | 7/2003 | Weikard et al. | |
| 6,617,413 B1* | 9/2003 | Bruchmann | A61K 6/09 156/275.5 |
| 8,343,601 B1* | 1/2013 | Ekin | C03C 17/322 428/34.4 |
| 9,034,472 B2* | 5/2015 | Subramanian | C03C 17/005 106/287.25 |
| 2004/0214912 A1 | 10/2004 | Rink et al. | |
| 2005/0244652 A1 | 11/2005 | Wagner et al. | |
| 2006/0128923 A1 | 6/2006 | Roesler et al. | |
| 2008/0132724 A1 | 6/2008 | Adkins | |
| 2008/0193785 A1* | 8/2008 | Kingma | B05D 7/08 428/541 |
| 2013/0011591 A1* | 1/2013 | Ekin | C03C 17/322 428/34.7 |
| 2014/0037874 A1* | 2/2014 | Subramanian | C03C 17/005 428/34.7 |

(Continued)

FOREIGN PATENT DOCUMENTS

| EP | 0 618 244 | 10/1994 |
|---|---|---|
| EP | 1 671 995 | 6/2006 |
| EP | 1 930 357 | 6/2008 |

(Continued)

OTHER PUBLICATIONS

Laromer LR 9000 Technical Data Sheet. No Author, No Date. Obtained from http://worldaccountbasf.com/wa/NAFTA~en_US/Catalog/FunctionalPolymers/doc4/BASF/PRD/30169160/.pdf?urn=urn:documentum:eCommerce_sol_EU:09007bb28013e533.pdf on Jun. 27, 2016.*

(Continued)

*Primary Examiner* — Michael A Salvitti
(74) *Attorney, Agent, or Firm* — Wenderoth, Lind, and Ponack, L.L.P.

(57) ABSTRACT

Disclosed are one-component compositions that include: (1) an isocyanate-functional urethane acrylate and (2) a polyisocyanate containing allophanate and/or uretdione groups, wherein the one-component composition has a viscosity of less than or equal to about 800 mPa·s and an isocyanate content of greater than about 5% by weight, based on the weight of the one-component composition. Also disclosed are circuit boards and electronic components that are coated with such compositions.

12 Claims, No Drawings

(56) References Cited

U.S. PATENT DOCUMENTS

2014/0199491 A1* 7/2014 Ekin .................... C08G 18/725
427/520
2015/0353772 A1* 12/2015 Ekin .................... C08G 18/725
524/874

FOREIGN PATENT DOCUMENTS

| JP | 2009-078380 | 4/2009 |
|----|-------------|--------|
| JP | 2013-159691 | 8/2013 |
| WO | 2013/041395 | 3/2013 |
| WO | 2014/012852 | 1/2014 |

OTHER PUBLICATIONS

International Search Report dated Mar. 27, 2014 in corresponding International Application No. PCT/EP2014/050379.

* cited by examiner

ONE-COMPONENT, DUAL-CURE CONFORMAL COATING COMPOSITIONS

BACKGROUND OF THE INVENTION

The present invention relates to one-component, dual-curing conformal coating compositions.

Conformal coatings are used to protect circuit boards and electronic components from moisture and from premature corrosion. Polyurethane coatings are a popular choice for conformal coatings due to their high chemical resistance, flexibility, and hardness.

Coatings curable by actinic radiation (e.g. "UV coatings") find use as conformal coatings as such coatings may be cured relatively quickly by exposure to a radiation source, typically UV light. The fast cure allows manufacturers to increase throughput. However, because circuit boards and other electronic components have highly contoured surfaces, such UV coatings, when used as conformal coatings, suffer from a phenomenon whereby areas of the coating which cannot easily be exposed to UV light due to the contours (i.e. the "shadow" areas) remain uncured.

U.S. Pat. No. 4,424,252 describes the problem of "shadow cure" and solves such problem by the use of dual cure resins. Such resins cure by two mechanisms: a) exposure to UV light and b) curing by atmospheric moisture. The atmospheric moisture reacts with free isocyanate groups in the dual cure resin forming an amine group(s). The amine groups react with other isocyanate groups to form a polyurea. The curing by atmospheric moisture allows the areas of the coatings in the "shadows" to fully cure.

However, dual-cure polyurethane resins have suffered a disadvantage due to their relatively high viscosity. This issue is especially relevant for conformal coatings, due to the contoured shape of the substrate. Low viscosity resins are more favoured from a flowability standpoint—i.e. the low viscosity resins more easily flow around the contours of a circuit board and may more evenly coat such circuit boards.

Previous attempts to lower the viscosity of dual-cure polyurethane resins included adding a significant amount of reactive diluent to the dual-cure polyurethane resins. While the addition of reactive diluents served to lower the viscosity of the resin, it also reduced the wt. % of free isocyanate groups in the resin. This, in turn, has the effect of reducing the effectiveness of the moisture cure mechanism especially in shadow areas, which results in a coating with insufficient hardness and/or solvent resistance in such areas.

An object of the present invention is to provide coating compositions, which are suitable as conformal coatings and are characterized by their ability to be cured by exposure to actinic radiation, their ability to be cured by exposure to atmospheric moisture and their relatively low viscosity and that permit to obtain coatings with sufficient hardness and solvent resistance, especially in shadow areas This object may be obtained with the coating compositions according to the invention, which are described below in greater detail.

SUMMARY OF THE INVENTION

The present invention relates to a one-component composition comprising: (1) an isocyanate-functional urethane (meth)acrylate and (2) a polyisocyanate containing allophanate and/or uretdione groups, wherein the one-component composition has (i) a viscosity of less than or equal to about 800 mPa·s according to ASTM Standard D 7395-07 using a Brookfield R/S Rheometer at 25° C., 100 s-1 shear rate for 2 minutes with a C-50-1 spindle, and (ii) an isocyanate content of greater than about 5% by weight, based on the weight of the one-component composition.

The present invention also relates to a conformal coating comprising the one-component composition.

Finally, the present invention relates to a circuit board or electronic component coated with the conformal coating.

DETAILED DESCRIPTION OF THE INVENTION

Various embodiments are described and illustrated in this specification to provide an overall understanding of the structure, function, operation, manufacture, and use of the disclosed products and processes. It is understood that the various embodiments described and illustrated in this specification are non-limiting and non-exhaustive Thus, the invention is not limited by the description of the various non-limiting and non-exhaustive embodiments disclosed in this specification. Rather, the invention is defined solely by the claims. The features and characteristics illustrated and/or described in connection with various embodiments may be combined with the features and characteristics of other embodiments. Such modifications and variations are intended to be included within the scope of this specification. As such, the claims may be amended to recite any features or characteristics expressly or inherently described in, or otherwise expressly or inherently supported by, this specification. Further, Applicant reserves the right to amend the claims to affirmatively disclaim features or characteristics that may be present in the prior art. The various embodiments disclosed and described in this specification can comprise, consist of, or consist essentially of the features and characteristics as variously described herein.

Any patent, publication, or other disclosure material identified herein is incorporated by reference into this specification in its entirety unless otherwise indicated, but only to the extent that the incorporated material does not conflict with existing definitions, statements, or other disclosure material expressly set forth in this specification. As such, and to the extent necessary, the express disclosure as set forth in this specification supersedes any conflicting material incorporated by reference herein. Any material, or portion thereof, that is said to be incorporated by reference into this specification, but which conflicts with existing definitions, statements, or other disclosure material set forth herein, is only incorporated to the extent that no conflict arises between that incorporated material and the existing disclosure material. Applicant reserves the right to amend this specification to expressly recite any subject matter, or portion thereof, incorporated by reference herein.

Reference throughout this specification to "various non-limiting embodiments," or the like, means that a particular feature or characteristic may be included in an embodiment. Thus, use of the phrase "in various non-limiting embodiments," or the like, in this specification does not necessarily refer to a common embodiment, and may refer to different embodiments. Further, the particular features or characteristics may be combined in any suitable manner in one or more embodiments. Thus, the particular features or characteristics illustrated or described in connection with various embodiments may be combined, in whole or in part, with the features or characteristics of one or more other embodiments without limitation. Such modifications and variations are intended to be included within the scope of the present specification. In this manner, the various embodiments described in this specification are non-limiting and non-exhaustive.

In this specification, other than where otherwise indicated, all numerical parameters are to be understood as being prefaced and modified in all instances by the term "about", in which the numerical parameters possess the inherent variability characteristic of the underlying measurement techniques used to determine the numerical value of the parameter. At the very least, and not as an attempt to limit the application of the doctrine of equivalents to the scope of the claims, each numerical parameter described in the present description should at least be construed in light of the number of reported significant digits and by applying ordinary rounding techniques.

Also, any numerical range recited in this specification is intended to include all sub-ranges subsumed within the recited range. For example, a range of "1 to 10" is intended to include all sub-ranges between (and including) the recited minimum value of 1 and the recited maximum value of 10, that is, having a minimum value equal to or greater than 1 and a maximum value equal to or less than 10. Any maximum numerical limitation recited in this specification is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The grammatical articles "one", "a", "an", and "the", as used in this specification, are intended to include "at least one" or "one or more", unless otherwise indicated. Thus, the articles are used in this specification to refer to one or more than one (i.e., to "at least one") of the grammatical objects of the article. By way of example, "a component" means one or more components, and thus, possibly, more than one component is contemplated and may be employed or used in an implementation of the described embodiments. Further, the use of a singular noun includes the plural, and the use of a plural noun includes the singular, unless the context of the usage requires otherwise.

In accordance with the present invention the term "(cyclo) aliphatically bound isocyanate groups" means aliphatically and/or cycloaliphatically bound isocyanate groups. As used herein, the term "(meth)acrylate" encompasses acrylates and methacrylates.

The present invention relates to a one-component composition comprising: (1) an isocyanate-functional urethane (meth)acrylate and (2) a polyisocyanate containing allophanate and/or uretdione groups, wherein the one-component composition has a viscosity of less than or equal to about 800 mPa·s and an isocyanate content of greater than about 5% by weight based on the weight of the one-component composition. In a preferred embodiment the one-component composition has a viscosity of less than or equal to 500 mPa·s, more preferably 450 mPa·s, most preferably less than or equal 400 mPa·s. The viscosity is measured at 25° C. according to ASTM Standard D 7395-07 using a Brookfield R/S Rheometer, 100 s-1 shear rate for 2 minutes with a C-50-1 spindle. In a preferred embodiment the isocyanate content is at least 6%, preferably at least 7% or, in some cases, more preferably at least 7.5%, and/or up to 15% by weight, based on the weight of the one-component composition.

As used herein, the term "one-component composition" refers to a composition in which all of the composition components, including, but not necessarily limited to, components (1) and (2) are stored together in a single container, such as a moisture-free container, until such time as the composition is to be used, such as by application to a substrate, including, for example, a substrate that is a circuit board or electronic component. The "one-component compositions" of the present invention are contrasted with two-part or two-component compositions in which components of the composition are stored separately and then combined at or near the time of use.

In certain embodiments, the compositions of the present invention are themselves substantially, or, in some cases, completely free of any isocyanate-reactive components, which, as used herein, refers to materials that contain functional groups, such as aminic, hydroxyl, or thiol groups, that are reactive towards isocyanate groups. As used herein, the term "substantially free" when used in this context means that any isocyanate-reactive component present in the composition is not present in an amount sufficient to render the composition unsuitable for use as a one-component composition. In other words, the isocyanate-reactive component is not present in an amount sufficient such that, due to its reaction with the isocyanate-containing components 1) and 2), the one-component composition would gel in the container, thereby rendering it unsuitable to be applied as a thin-film coating to a substrate.

In certain embodiments, the one-component compositions of the present invention are high solids compositions, which, as used herein, means that the total solids content of the composition is at least 90 percent by weight, at least 95 percent by weight, or, in some cases, at least 99 percent by weight, the weight percents being based on the total weight of the one-component composition. In a preferred embodiment of a composition of the invention, the solids content is at least 90 percent by weight, preferably at least 95 percent by weight, most preferably at least 99 percent by weight. Indeed, it was surprising to achieve such high-solids, one-component, dual cure compositions, having the viscosities and isocyanate content described herein.

Component (1) is an isocyanate-functional urethane (meth)acrylate, as described in, for example, U.S. Pat. No. 6,599,955, the entirety of which is incorporated herein by reference.

Isocyanate-functional urethane (meth)acrylates are prepared from monohydric alcohols containing one ore more (meth)acryloyl group(s) and di- or polyisocyanates. The urethane (meth)acrylates according to the present invention contain free isocyanate groups, prepared generally as described for urethane acrylates above, but with the equivalent ratio of NCO (isocyanate) groups to OH (hydroxyl) groups being 1:0.2 to 1:0.8, such as 1:0.3 to 1:0.6. In a preferred embodiment the ratio of NCO to OH groups is 1:0.3 to 1:0.6.

Monohydric alcohols containing one or more (meth) acryloyl group(s) are understood as including both esters, containing a free hydroxyl group, of acrylic acid or methacrylic acid with dihydric alcohols, such as 2-hydroxyethyl, 2- or 3-hydroxypropyl or 2-, 3- or 4-hydroxybutyl (meth) acrylate, and mixtures of such compounds. Monohydric alcohols containing one or more (meth)acryloyl group(s) or reaction products substantially containing such alcohols, which are obtained by esterification of n-hydric alcohols with (meth)acrylic acid, are also possible. It is also possible to employ mixtures of different alcohols, so that n represents an integer or a fractional number from 2 to 4, in which 3(n-0.8) to (n-1.2), such as (n-1) mol of (meth)acrylic acid is employed per mol of the alcohols mentioned. These compounds or product mixtures include the reaction products of (i) glycerol, trimethylolpropane and/or pentaerythritol, low molecular weight alkoxylation products of such alcohols (such as ethoxylated or propoxylated trimethylolpropane, for example the addition product of ethylene oxide on trimethylolpropane of OH number 550), or of mixtures of such at least trihydric alcohols with dihydric alcohols (such as ethylene glycol or propylene glycol), with (ii) (meth)acrylic acid in the molar ratio mentioned.

These compounds often have a number-average molecular weight $M_n$ of 116 g/mole to 1,000 g/mole, such as 116 to 750 g/mole, or, in some cases, 116 to 158 g/mole as determined by gel permeation chromatography (GPC) using polystyrene standards according to ASTM Standard D 5296-11. In a preferred embodiment these compounds have a number-average molecular weight $M_n$ of 116 g/mole to 1,000 g/mole, preferably 116 to 750 g/mole, more preferably 116 to 158 g/mole as determined by gel permeation chromatography (GPC) using polystyrene standards according to ASTM Standard D 5296-11.

Some specific examples of suitable (meth)acrylate-functional materials include hydroxymethyl (meth)acrylate, hydroxyethyl (meth)acrylate (HEA), hydroxypropyl (meth)acrylate (HPA), trimethylol propane di(meth)acrylate, pentaerythritol tri(meth)acrylate, GAMA ((meth)acrylic acid adduct of glycidyl (meth)acrylate), which can include the two isomers

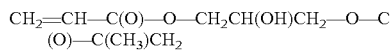

and

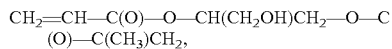

or a polycaprolactone hydroxy ethyl (meth)acrylate (PCHEA) can be used, however any hydroxyl functional (meth)acrylate can be used as described in the above defined structure. In a preferred embodiment, the one-component composition comprises a monohydric alcohol containing one or more (meth)acryloyl groups which is selected from the list consisting of hydroxymethyl (meth)acrylate, hydroxyethyl (meth)acrylate, hydroxypropyl (meth)acrylate, trimethylol propane di(meth)acrylate, pentaerythritol tri(meth)acrylate, a (meth)acrylic acid adduct of glycidyl (meth)acrylate, and/or a polycaprolactone hydroxy ethyl (meth)acrylate.

In a particular embodiment of the invention, PCHEA is used either alone or in mixtures with other hydroxy functional (meth)acrylates to achieve low viscosity materials.

In a preferred embodiment, the polycaprolactone hydroxy ethyl (meth)acrylate (PCHEA) is a poly(ε-caprolactone) ester of 2-hydroxyethyl acrylate. In an additional embodiment of the invention, the PCHEA is TONE® M 100 (poly(ε-caprolactone caprolactone) ester of 2-hydroxyethyl acrylate) available from DOW Chemical Corp., Midland Mich.

In another particular embodiment of the invention, HEA or HPA are useful as the sole hydroxy functional (meth)acrylate, however, in some cases, these materials tend to crystallize, so that the resin cannot be used neat, but must be dissolved. Solvents, typically ester, ether or hydrocarbon solvents can be used. Esters which are particularly useful also have acrylic functionality, such as hexanediol diacrylate, which would make the solution 100% reactive under UV/EB conditions.

Suitable di- or polyisocyanates include aromatic, araliphatic, cycloaliphatic, and aliphatic compounds, aliphatic compounds being preferred. Examples include butylene-diisocyanate, hexamethylene-diisocyanate (HDI), isophorone-diisocyanate (IPDI), trimethylhexamethylene-diisocyanate (2,2,4- and/or 2,4,4-trimethylhexa-methylene-diisocyanate), neopentyl diisocyanate, dicyclohexylmethane-diisocyanate or 4-isocyanatomethyl-1,8-octane-diisocyanate and derivatives of these diisocyanates containing with a urethane, isocyanurate, allophanate, biuret, uretdione and/or iminooxadiazinedione groups. Di- or polyisocyanates which contain urethane groups and are based on di- or polyisocyanates and dihydric alcohols are also suitable.

Examples of suitable isocyanate-functional urethane acrylates are the commercially available DESMOLUX® line from Bayer MaterialScience LLC in Pittsburgh, Pa. DESMOLUX® D100, DESMOLUX® VPLS 2396, DESMOLUX® XP 2510, and Desmolux® D 200XP are specific examples.

In certain embodiments, component (1) is present in the one-component composition of the present invention in an amount of at least 10 percent by weight, such as at least 20 percent by weight, at least 30 percent by weight, or, in some cases, at least 40 percent by weight and/or no more than 90 percent by weight, no more than 80 percent by weight, no more than 70 percent by weight, or, in some cases, no more than 60 percent by weight, all of these weight percents being based on the total weight of the coating composition. In a preferred embodiment, component (1) is present in the one-component composition of the present invention in an amount between 40 percent by weight and 60 percent by weight, more preferably around 50 percent by weight.

As component (2) of the one-component coating composition polyisocyanates containing uretdione and/or allophanate groups are used. In a preferred embodiment of the one-component composition of the present invention, component (2) comprises a polyisocyanate containing uretdione groups.

Suitable polyisocyanates containing uretdione groups include, for example, uretdione diisocyanates prepared by oligomerizing a portion of the isocyanate groups of a diisocyanate in the presence of a suitable catalyst, e.g., a trialkyl phosphine catalyst. Suitable polyisocyanates containing allophanate groups include, for example, those prepared according to the processes disclosed in U.S. Pat. Nos. 3,769,318, 4,160,080, 4,177,342, and 6,392,011. In some embodiments, the catalyst for the preparation of these polyisocyanates include organic tin(II) salts such as tin(II) octoate.

In the compositions of the present invention the polyisocyanates containing uretdione and/or allophanate groups may be used in admixture with other aliphatic and/or cycloaliphatic polyisocyanates. For example, and without limitation, such other aliphatic and/or cycloaliphatic polyisocyanates can include: (1) an isocyanurate group-containing polyisocyanate, such as may be prepared as set forth in DE 2,616,416; EP 3,765; EP 10,589; EP 47,452; U.S. Pat. No. 4,288,586 and U.S. Pat. No. 4,324,879; and/or (2) biuret group-containing polyisocyanates, such as may be prepared according to the processes disclosed in U.S. Pat. Nos. 3,124,605; 3,358,010; 3,644,490; 3,862,973; 3,903,126; 3,903,127; 4,051,165; 4,147,714; or 4,220,749 by using co-reactants such as water, tertiary alcohols, primary and secondary monoamines, and primary and/or secondary diamines.

Examples of suitable polyisocyanates which may be used in the polyisocyanate component containing allophanate and/or uretdione groups include a) polyisocyanate adducts and b) isocyanate prepolymers having an average functionality of 1.5 to 6, such as 1.8 to 6, 2 to 6 or, in some cases, 2 to 4. Polyisocyanate adducts are preferred.

The polyisocyanates adducts often have an average functionality of 2 to 6, such as 2 to 4, and an isocyanate content of 5 to 30% by weight, such as 10 to 25% by weight and, in some cases, 15 to 25% by weight.

Suitable polyisocyanates include the commercially available DESMODUR® line from Bayer MaterialScience LLC in Pittsburgh, Pa. Specific allophanate-containing polyisocyanates include DESMODUR® XP 2580 and specific uretdione-containing polyisocyanates include DESMODUR® XP 2730. Preferred allophanate-containing polyisocyanates include DESMODUR® XP 2580. Preferred uretdione-containing polyisocyanates include DESMODUR® XP 2730.

In certain embodiments, the isocyanate groups of components (1) and (2) are at least partially unblocked. As such, embodiments of the one component compositions of the present invention are capable of cure at low temperatures, including temperatures of less than 100° C. or less than 50° C.

In certain embodiments, component (2) is present in the one-component composition of the present invention in an amount of at least 1 percent by weight, such as at least 5 percent by weight, or, in some cases, at least 10 percent by weight and/or no more than 50 percent by weight, no more than 40 percent by weight, no more than 30 percent by weight, or, in some cases, no more than 20 percent by weight, all of these weight percents being based on the total weight of the coating composition. In a preferred embodiment of the one-component composition of the present invention, component (2) is present in an amount of 20 to 30 percent by weight based on the total weight of the coating composition. Preferably, component (1) is present in an amount around 50 percent by weight and component (2) is present in an amount of 20 to 30 percent by weight based on the total weight of the coating composition.

In some embodiments, the one-component compositions comprise a reactive diluent in addition to the reactive components described above. Suitable reactive diluents include, for example, vinyl ethers and mono-, di, or higher-functional (meth)acrylate monomers, such as those monomers that contain at least 4, at least 6, at least 8, at least 9, or, in some cases, at least 10 carbon atoms in the alkyl moiety (which may be linear, branched, alicyclic, substituted, or unsubstituted, for example). Exemplary mono-(meth)acrylates suitable for use in the present invention include butyl(meth)acrylates, hexyl(meth)acrylate, pentyl (meth)acrylates, heptyl(meth)acrylates, octyl(meth)acrylates, 2-ethylhexyl(meth)acrylate, nonyl(meth)acrylates, decyl(meth)acrylates, bornyl(meth)acrylates, such as isobornyl(meth)acrylate, dicyclopentanyl(meth)acrylates, cyclohexyl(meth)acrylates, lauryl(meth)acrylates, stearyl(meth) acrylates, alkoxyalkyl(meth)acrylates, such as butoxyethyl acrylate, among others. Exemplary di- or higher-(meth) acrylates suitable for use in the present invention include ethylene glycol di(meth)acrylate; dipropylene glycol diacrylate; hexanediol di(meth)acrylate; triethylene glycol di(meth)acrylate; tetraethylene glycol di(meth)acrylate; trimethylolpropane tri(meth)acrylate; ethoxylated trimethylolpropane tri(meth)acrylate; glycerol tri(meth) acrylate; pentaerythritol tri(meth)acrylate; pentaerythritol tetra(meth)acrylate; neopentylglycol di(meth)acrylate. In a preferred embodiment, the reactive diluent is hexanedioldiacrylate.

In certain embodiments, the reactive diluent is present in an amount of up to 50 percent by weight, such as 10 to 50 percent by weight, or, in some cases, 30 to 50 percent by weight, based on the total weight of the composition. In a preferred embodiment, hexanedioldiacrylate is present in the composition according to the invention in an amount of 25 to 60 percent by weight, based on the total weight of the composition.

The one-component compositions preferably do not contain substantial amounts of water; they generally contain less than 0.1% of water. In order to scavenge moisture in the compositions, moisture scavengers such as p-toluenesulfonyl isocyanate may be added to the composition.

The coating compositions according to the invention can be mixed with known additives. These include fillers, pigments, dyestuffs, thixotropic agents, levelling agents, matting agents or flow agents, which are employed in the conventional amounts.

The application of the coating compositions of the invention to the material to be coated takes place with the methods known and customary in coatings technology, such as spraying, knife coating, curtain coating, vacuum coating, rolling, pouring, dipping, spin coating, squeegeeing, brushing or squirting or by means of printing techniques such as screen, gravure, flexographic or offset printing and also by means of transfer methods.

UV curing is initiated in the presence of photoinitiators. Suitable photoinitiators include, for example, aromatic ketone compounds, such as benzophenones, alkylbenzophenones, Michler's ketone, anthrone and halogenated benzophenones. Further suitable compounds include, for example, 2,4,6-trimethylbenzoydiphenylphosphine oxide, phenylglyoxylic acid esters, anthraquinone and the derivatives thereof, benzil ketals and hydroxyalkyl-phenones. Illustrative of additional suitable photoinitiators include 2,2-diethoxyacetophenone; 2- or 3- or 4-brompacetophenone; 3- or 4-allylacetophenone; 2-acetonaphthone; benzaldehyde; benzoin; the alkyl benzoin ethers; benzophenone; benzoquinone; 1-chloroanthraquinone; p-diacetyl-benzene; 9,10-dibromoanthracene 9,10-dichloroanthracene; 4,4-dichlorobenzophenone; thio xanthone; isopropyl-thioxanthone; methylthio xanthone; α,α,α-trichloro-para-t-butyl acetophenone; 4-methoxybenzophenone; 3-chloro-8-nonylxanthone; 3-iodo-7-methoxyxanthone; carbazole; 4-chloro-4'-benzyl-benzophenone; fluoroene; fluoroenone; 1,4-naphthylphenylketone; 1,3-pentanedione; 2,2-di-sec.-butoxy acetophenone; dimethoxyphenyl acetophenone; propiophenone; isopropylthioxanthone; chlorothioxanthone; xanthone; maleimides and their derivatives; and mixtures thereof. There are several suitable photoinitiators commercially available from Ciba including Irgacure® 184 (1-hydroxy-cyclohexyl-phenyl-ketone), Irgacure® 819 (bis(2,4,6-trimethylpentyl)-phenylphosphincoxide), Irgacure® 1850 (a 50/50 mixture of bis(2,6-dimethoxybenzoyl)-2,4,4-trimethykpentyl-phosphine oxide and 1-hydroxy-cyclohexyl-phenyl-ketone), Irgacure® 1700 (25/75 mixture of bis(2,6 dimethoxybenzoyl)-2,4,4-trimethylpentyl-phosphine oxide and 2-hydroxy-2-methyl-1-phenyl-propan-1-one). Irgacure® 907 (2-methyl-1[4-(methylthio)phenyl]-2-morpholonopropan-1-one), Darocur® MBF (a phenyl glyoxylic acid methyl ester), Irgacure® 2022 Photoinitiator blend (20% by weight of phenylbis(2,3,6-trimethyl benzoyl)phosphine oxide and 80% by weight of 2-hydroxy-2-methyl-1-phenyl-1-propanone) and Darocur® 4265 (a 50/50 mixture of bis(2,4,6-trimethylbenzoyl)-phenylphosphineoxide and 2-hydroxy-2-methyl-1-phenyl-propan-1-one). Mixtures of the foregoing photoinitiators may also be used. The foregoing lists are meant to be illustrative only and are not meant to exclude any suitable photoinitiators.

Those skilled in the art of photochemistry are fully aware that photoactivators can be used in combination with the aforementioned photoinitiators and that synergistic effects are sometimes achieved when such combinations are used. Photoactivators are well known in the art and require no further description to make known what they are and the concentrations at which they are effective. Nonetheless, one can mention as illustrative of suitable photoactivators, methylamine, tributylamine, methyldiethanolamine, 2-aminoethylethanolamine, allylamine, cyclohexylamine, cyclopentadienylamine, diphenylamine, ditolylamine, trixylylamine, tribenzylamine, n-cyclohexylethylen-eimine, piperidine, N-methylpiperazine, 2,2-dimethyl-1,3-bis(3-N-morpholinyl)-propionyloxypropane, and mixtures thereof.

The radiation can be provided by any suitable source such as UV lamps having with or reduced infrared emission or UV lamps fitted with filters to eliminate infrared emissions or so-called LEDs (light-emitting devices) emitting radiation in the wavelength noted. Particularly useful commercially available devices include: the Fusion and Nordson high-intensity microwave powered lamps (mercury, iron doped and gallium doped lamps), high-intensity standard arc lamps, the Panacol UV H-254 lamp (available from Panacol-Elosol GmbH)—a 250 W ozone-free, iron doped metal halide lamp with spectral wavelength of from 320 to 450 nm; Panacol UVF-450 (320 nm to 450 nm depending on the black, blue or clear filter used); Honle UVA HAND 250 CUL (available from Honle UV America Inc.)—emitting maximum intensity UVA range of ~320 to 390 nm; PMP 250 watt metal halide lamp (available from Pro Motor Car Products Inc.); Cure-Tek UVA-400 (available from H&S Autoshot) which has a 400-watt metal halide bulb and the lamp assembly can be fitted with different filters like blue, light blue or clear to control/eliminate the infra-red radiation from the lamp source); Con-Trol-Cure Scarab-250 UV-A shop lamp system (available from UV Process Supply Inc.—has a 250 W iron doped metal halide lamp with a spectral wavelength output of 320 to 450 nm); Con-Trol-Cure—UV LED Cure-All 415 (available from UV Process Supply Inc.—spectral wavelength of 415 nm with a 2.5 to 7.95 W operating wattage range); Con-Trol-Cure—UV LED Cure-All 390 (available from UV Process Supply Inc.—spectral wavelength of 390 nm with a 2.76 to 9.28 W operating wattage range); UV H253 UV lamp (available from UV Light Technologies—the unit contained a 250 W iron doped metal halide lamp fitted with a black glass filter to produce a spectral wavelength of between 300 and 400 nm); Radion RX10 module curing using solid state high intensity UV light source from Phoseon Technology; Low intensity microwave UV System Model QUANT-18/36 (available from Quantum Technologies—UV Intensity range: 3-30 mW/cm2; UV Spectral range: 330-390 nm); WorkLED (available from Inretech Technologies using 400 nm LED arrays); Flashlight MC with 20×LED adapter (available from Inretech Technologies using 400 nm LEDs); and Phillips TL03 lamp with radiation output above 380 nm; and sunlight.

In a preferred embodiment a composition according to an embodiment of the invention is used for conformal coating of a circuit board or electronic component. The present invention therefor also relates to a method for conformal coating of a substrate, preferably a circuit board or an electronic component, comprising depositing the composition according to the invention over at least a portion of said substrate and exposing the coated substrate to actinic radiation. In a preferred embodiment, the microhardness of the coating of a substrate coated with a coating obtainable using a composition according to the invention, is at least 100 mN/mm$^2$ measured using the method DIN 14577. In a more preferred embodiment, said microhardness is above 120 mN/mm$^2$, even more preferably above 150 mN/mm2, most preferably above 190 mN/mm$^2$.

In the following examples all parts and percentages are weight percentages, unless otherwise indicated.

EXAMPLES

Materials Used in the Examples

Desmolux® D 100 (NCO containing aliphatic urethane acrylate, Bayer MaterialScience LLC, Pittsburgh, Pa.); Desmolux® VPLS 2396 (NCO containing aliphatic urethane acrylate, Bayer MaterialScience LLC, Pittsburgh, Pa.); Desmolux® XP 2510 (NCO containing aliphatic urethane acrylate, Bayer MaterialScience LLC, Pittsburgh, Pa.); Desmodur® XP 2730 (low viscosity uretdione group-containing polyisocyanate, Bayer MaterialScience LLC, Pittsburgh, Pa.); Miramer® M200 (Hexanedioldiacrylate (reactive diluent) Rahn USA Corp. Aurora, Ill.); Genomer® 1121 (isobornyl acrylate (reactive diluent) Rahn USA Corp. Aurora, Ill.); Tinopal® OB (optical brightener, BASF Florham Park, N.J.); Byk® 371 (flow and levelling additive, Wallingford, Conn.); Irgacure® 819 (photoinitiator, BASF Florham Park, N.J.); Darocur® 1173 (photoinitiator, BASF Florham Park, N.J.); p-toluenesulfonyl isocyanate (moisture scavenger, VanDeMark Chemical Inc. Lockport, N.Y.).

Formulation Details

Formulations; A, B, D, O, P, Q, R, and S were prepared using similar procedures. Miramer M200, Genomer 1121, Tinopal OB, Byk 371, Irgacure 819, Darocur 1173 (non isocyanate containing ingredients) were mixed in a tin can and moisture content was measured by Karl Fischer Titration according to ASTM D6304-07. After measuring the water content theoretical amount of moisture scavenger p-toluenesulfonyl isocyanate was calculated. To be on the safe side and ensure all moisture is scavenged 10% excess p-toluenesulfonyl isocyanate was calculated. Finally Desmolux D 100, Desmolux VPLS 2396, Desmolux XP 2510, and/or Desmodur XP 2730 were added into the formulation.

As used herein, parts means parts by weight.

The Example A (Comparison) formulation was prepared as follows: 40 parts of Miramer M200, 40 parts of Genomer 1121, 0.2 parts of Tinopal OB, 1.8 parts of Byk 371, and 5.4 parts Irgacure 819 were mixed in a tin can. The can was attached to an overhead stirrer. Moisture content was measured using Karl Fischer Titration according to ASTM D6304-07. With 10% excess moisture scavenger it was calculated that 1.26 parts p-toluenesulfonyl isocyanate is needed. While solution was mixing with an overhead stirrer, 1.26 part of p-toluenesulfonyl isocyanate was added into the solution. The resulting formulation was mixed for 30 minutes to ensure the consumption of all the moisture. Finally 90 parts Desmolux D 100 and 10 parts Desmolux VPLS 2396 were added into the formulation while stirring. The resulting formulation was stirred for 5 minutes and purged with nitrogen before covering it with the lid. The formulation made was left at room temperature to de aerate.

Examples B, D, O P, Q, R, and S were prepared utilizing the procedure set forth for Comparative Example A, utilizing the materials and amounts (parts) set forth in Table 1 below.

Application and Testing Details

Viscosities of the formulations were measured according to ASTM Standard D 7395-07 using a Brookfield R/S Rheometer at 25° C., 100 s$^{-1}$ shear rate for 2 minutes with a C-50-1 spindle. "Initial viscosity" refers to the viscosity of the composition at the time it was made and "final viscosity" refers to the viscosity of the composition at storage for 6 months at ambient conditions.

Coatings for microhardness tests were prepared by applying 2 mils of formulations onto Bonderite® B1000 cold rolled steel panels. Microhardness (Marten's hardness) measurements were done using Fischerscope H100C instrument with the method DIN 14577. Microhardness readings were taken under a 30 mN test load run to a maximum of 5 μm indentation depth over a 20 second application time. Results were reported as an average of 3 readings for each formulation.

Coatings for MEK double rubs were prepared by applying 2 mils of formulations onto Bonderite B1000 cold rolled steel panels. MEK double rubs were measured using the method ASTM D4752-10.

Cure Details

The coatings were cured with Fusion UV equipment under 400 Watt Hg bulb at 10 feet/minute. To finalize the moisture cure component UV cured panels were left in a dark constant humidity (50% atmospheric humidity) and temperature room (75° F.) for 2 weeks. If 0.1% catalyst dibutyltin diluarate is used, 3 days is enough for moisture cure.

For moisture curing only, the panels were not subjected to UV light and placed in a dark constant humidity and temperature room for 2 weeks. If 0.1% catalyst dibutyltin diluarate is used, 3 days is enough for moisture cure.

Discussion of Results

From the results summarized in Table 1 it can be seen that compositions O, P, Q, R and S comprising a polyisocyanate containing uretdione-groups (Desmodur® XP 2730) in addition to an isocyanate functional urethane (meth)acrylate and an isocyanate content above 6 wt % provide an initial viscosity of less than 800 mPa·s. Coatings prepared with these compositions were characterized by a microhardness above 100 mN/mm2, whereas comparative examples stayed below 100 mN/mm2. A difference can also be seen in the MEK double rubs test with moisture cure only, which simulates shadow cure. The inventive examples showed a value of at least 15, whereas the comparative examples A, B and D had a value of 5.

Although the invention has been described in detail in the foregoing for the purpose of illustration, it is to be understood that such detail is solely for that purpose and that variations can be made therein by those skilled in the art without departing from the spirit and scope of the invention except as it may be limited by the claims.

TABLE 1

| Ingredient | Example | | | | | | | |
| --- | --- | --- | --- | --- | --- | --- | --- | --- |
| | A | B | D | O | P | Q | R | S |
| Desmolux ® D 100 | 90 | 50 | — | 50 | 50 | — | — | — |
| Desmolux ® VP LS 2396 | 10 | 50 | 100 | 50 | 50 | 50 | 50 | 50 |
| Desmolux ® XP 2510 | — | — | — | — | — | 50 | 50 | 50 |
| Desmodur ® XP 2730 | — | — | — | 20 | 30 | 40 | 30 | 20 |
| Miramar ® M200 | 40 | 40 | 40 | 30 | 25 | 40 | 50 | 60 |
| Genomer ® 1121 | 40 | 40 | 40 | 30 | 25 | — | — | — |
| Tinopal ® OB | 0.2 | 0.2 | 0.2 | 0.2 | 0.2 | 0.2 | 0.2 | 0.2 |
| BYK ® 371 | 1.8 | 1.8 | 1.8 | 1.8 | 1.8 | 1.8 | 1.8 | 1.8 |
| Irgacure ® 819 | 5.4 | 5.4 | 5.4 | 5.4 | 5.4 | — | — | — |
| Darocur ® 1173 | — | — | — | — | — | 7.2 | 9 | 9 |
| p-Toluenesulfonyl Isocyanate | 1.26 | 1.26 | 1.26 | 1.26 | 1.26 | 1.26 | 1.26 | 1.26 |
| Weight Solids | 99.43 | 99.43 | 99.43 | 99.43 | 99.43 | 96.81 | 96.84 | 96.84 |
| Wt/Gal | 8.88 | 8.93 | 8.99 | 9.05 | 9.11 | 9.29 | 9.23 | 9.18 |
| Volume Solids | 99.29 | 99.29 | 99.28 | 99.28 | 99.27 | 95.94 | 96.01 | 96.03 |
| % NCO | 6.5 | 5.38 | 3.98 | 7.79 | 8.99 | 8.5 | 7.24 | 6.05 |
| P/B | 0 | 0 | 0 | 0 | 0 | 0.3 | 0.29 | 0.29 |
| Theoretical VOC | 0.05 | 0.05 | 0.05 | 0.05 | 0.05 | 0.05 | 0.05 | 0.05 |
| PVC | 0.09 | 0.09 | 0.09 | 0.1 | 0.1 | 0.1 | 0.1 | 0.1 |
| Initial Viscosity (mPa · s) | 500 | 510 | 525 | 480 | 425 | 690 | 327 | 240 |
| Final Viscosity (mPa · s) | 600 | 770 | 650 | 575 | 635 | 780 | 430 | 320 |
| Microhardness (mN/mm2) | 73 | 72 | 86 | 153 | 193 | 123 | 113 | 129 |
| MEK Double Rubs | >200 | >200 | >200 | >200 | >200 | >200 | >200 | >200 |
| MEK Double Rubs (moisture cure only) | 5 | 5 | 5 | 20 | 25 | 20 | 20 | 15 |

The invention claimed is:

1. A one-component composition comprising two components, wherein:
   a first component is an isocyanate functional urethane (meth)acrylate, which is a reaction product of a composition comprising: (a) a polycaprolactone hydroxy ethyl (meth)acrylate; and (b) a di- or polyisocyanate, and
   a second component is a polyisocyanate containing allophanate and/or uretdione groups,
   which is different from the first component, and
   wherein the one-component composition has:
   (i) a viscosity of less than or equal to about 800 mPa·s according to ASTM Standard D 7395-07 using a Brookfield R/S Rheometer at 25° C., 100 s-1 shear rate for 2 minutes with a C-50-1 spindle, and
   (ii) an isocyanate content of greater than about 5% by weight, based on the weight of the one-component composition.

2. The one-component composition of claim 1, wherein a solids content of the composition is at least 90 percent by weight, based on the total weight of the one-component composition.

3. The one-component composition of claim 1, wherein the polycaprolactone hydroxy ethyl (meth)acrylate is a poly (c-caprolactone) ester of 2-hydroxyethyl acrylate.

4. The one-component composition of claim 1, wherein the first component is present in an amount of at least 40 percent by weight, based on the total weight of the composition.

5. The one-component composition of claim 1, wherein the first component is present in an amount of no more than 60 percent by weight, based on the total weight of the composition.

6. The one-component composition of claim 1, wherein the second component comprises a polyisocyanate containing uretdione groups.

7. The one-component composition of claim 1, wherein the second component is present in an amount of at least 10 percent by weight and no more than 30 percent by weight, based on the total weight of the composition.

8. The one-component composition of claim 1, further comprising a reactive diluent comprising a mono-functional (meth)acrylate monomer containing at least 6 carbon atoms in the alkyl moiety that is present in an amount of up to 50 percent by weight, based on the total weight of the composition.

9. The one-component composition of claim 1, wherein the composition has an isocyanate content of greater than about 6% by weight and a solids content of at least 95 percent by weight, based on the total weight of the composition.

10. A method for conformal coating of a substrate, comprising depositing the composition of claim 1 over at least a portion of said substrate and exposing the coated substrate to actinic radiation.

11. The method of claim 10, wherein the substrate comprises a circuit board or electronic component.

12. A substrate coated with a coating obtained from the composition according to claim 1, wherein the microhardness of the coating is above 100 mN/mm2 measured using the method DIN 14577.

* * * * *